United States Patent [19]
Park

[11] Patent Number: 5,673,004
[45] Date of Patent: Sep. 30, 1997

[54] METHOD AND CIRCUIT FOR CONTROLLING DIGITAL PROCESSING PHASE-LOCKED LOOP FOR NETWORK SYNCHRONIZATION

[75] Inventor: Jung-Hee Park, Kyongki-do, Rep. of Korea

[73] Assignee: LG Information & Communications, Ltd, Rep. of Korea

[21] Appl. No.: 526,574

[22] Filed: Sep. 11, 1995

[30] Foreign Application Priority Data

Sep. 15, 1994 [KR] Rep. of Korea .................. 94-23408

[51] Int. Cl.$^6$ ....................................... H03L 7/08
[52] U.S. Cl. ......................... 331/1 A; 331/25; 331/14; 331/DIG. 2; 375/356; 375/357; 375/376; 327/156; 327/159
[58] Field of Search ........................ 331/1 A, 25, 14, 331/DIG. 2; 375/376, 375, 356, 357; 327/156, 159

[56] References Cited

U.S. PATENT DOCUMENTS

| | | | |
|---|---|---|---|
| 4,305,045 | 12/1981 | Metz et al. | 331/1 A |
| 4,598,257 | 7/1986 | Southard | 331/2 |
| 4,914,404 | 4/1990 | Ernst | 331/11 |
| 5,136,617 | 8/1992 | Stenard | 331/1 A X |

OTHER PUBLICATIONS

Hiroshi Fukinuki and Isao Furukawa, *Intelligent PLL Using Digital Processing for Network Synchronization*, IEEE Transactions On Communications, vol. Com-31, No. 12, Dec. 1983.

*Primary Examiner*—Robert Pascal
*Assistant Examiner*—Arnold Kinkead
*Attorney, Agent, or Firm*—Cooper & Dunham LLP

[57] ABSTRACT

The present invention discloses a control algorithm of digital processing-phase locked loop(DP-PLL) for network synchronization to prevent phase-hit generated at the time of transition of the operation mode. The control process of DP-PLL includes the steps of setting a value corresponding to an initial center frequency at a voltage-controlled oscillator at the initial stage and bringing into a free-run mode determining the mode to be in a normal state unless the abnormality of the reference clock signal is not monitored at the free-run mode and transferring the free-run mode into the fast mode storing phase deviation data for a predetermined period of time at the initial process and computing its average value to set the average value as a reference phase deviation of the fast mode computing and controlling a control value of the voltage controlled oscillator to converge the phase deviation data into the reference phase deviation and transferring the fast mode into a normal mode once the fast mode becomes stable, storing the phase deviation data for a predetermined period of time at the initial process, measuring an average value to set the average value as a reference phase deviation of the normal mode, and computing and controlling a control value of the voltage-controlled oscillator that is converged into the reference phase deviation.

8 Claims, 7 Drawing Sheets

FIG. 2(A) Fr (8KHz)
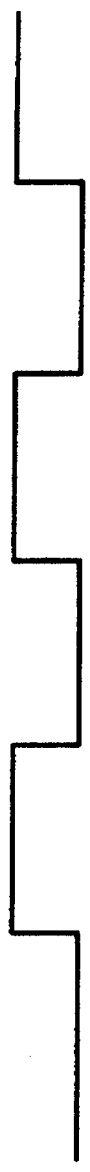
FIG. 2(B) Fs (8KHz)
FIG. 2(C) PD

METHOD AND CIRCUIT FOR CONTROLLING DIGITAL PROCESSING PHASE-LOCKED LOOP FOR NETWORK SYNCHRONIZATION

BACKGROUND OF THE INVENTION

(1) Field of the Invention

The present invention relates to a control algorithm of digital processing phase-locked loop(DP-PLL) for network synchronization, and particularly to a method and circuit for controlling digital processing phase-locked loop for network synchronization to prevent discontinuity of phase, so called "phase-hit" generated at the time of switching of a reference timing signal and transition of the operation mode.

An integrated digital network, which consists of digital exchanges interconnected with digital transmission facilities, as a desirable communication network.

In such an integrated digital network, a system to synchronize all office clocks is indispensable. From among the various network synchronization systems, we have chosen a loosely coupled master-slave system in which each slave office has a stable oscillator locked in to a master clock.

As a key component of a loosely coupled master-slave system, intelligent PLL using digital processing(DP-PLL) was disclosed in IEEE TRANSACTIONS ON COMMUNICATIONS VOL. COM-31, NO. 12, DECEMBER 1983.

Such an DP-PLL receives single reference timing signal and produces a local clock adjusted to be in synchronization with the reference timing signal.

However, the DP-PLL requires a precision voltage controlled crystal oscillator (VCXO) to prevent free-run.

FIG. 1 depicts prior art another DP-PLL having a structure similar to the above DP-PLL. This DP-PLL includes a reference timing receiving part 11 that receives a reference timing signal inputted from outside; a phase deviation detector 12 uses a reference clock Fr derived from the reference timing receiving part 11 and clocks FS and Fc frequency-divided from a system clock signal to detect phase deviation data PD; a common memory 13 that stores the phase deviation data PD produced from the phase deviation detector 12; a central processing unit (CPU)14 processing the phase deviation data read out in the common memory 13 according to control algorithm to control the system clock to be synchronized with reference clock; a monitor 15 sensing the loss of the reference clock signal to output it to the CPU 14; a digital/analog (D/A) converter 16 converting a digital signal produced from the CPU 14 into an analogue signal; a voltage controlled oscillator (VCO) 17 synchronizing the system clock with the reference clock in response to an output signal of the D/A converter 16; a divider 18 dividing a clock produced from the VCO 17 and producing it to the phase deviation detector 12; and a frequency distributor 19 producing signals of the frequency that is required in the system, using the clock produced from the VCO 17.

The operation of the conventional DP-PLL for network synchronization is described with reference to the waveform of FIG. 2.

If the system starts to operate and a reference timing signal is inputted, the reference timing receiver 11 produces the reference clock Fr of 8 KHz as shown in FIG. 2A, and this reference clock is applied to the phase deviation detector 12. The phase deviation detector 12 obtains a phase deviation data between the reference clock and the divided clock signal Fs of 8 KHz inputted from the divider 18 by a counter clock Fc, counts high level period of the phase deviation data PD shown in FIG.(C), and stores this counted value in the common memory 13 as quantized phase deviation data between the reference clock and clock.

The CPU 14 reads out the phase deviation data PD stored in the common memory 13 for 8.192 sec at every time period of 250 s, and determines whether the read data is within the effective limit. If the data is within the effective limit, the CPU computes an average value of the phase error.

The cpu 14 produces a control value of the VCO 17 by multiplying the average value by a varying weighted value according to respective mode.

The CPU 14 produces a control value of the VCO 17 by varying respective proportional constant and integrating constant according to the fast made and normal mode.

If the data exceeding the effective limit is detected, the CPU 14 determines if the reference clock signal is lost or not. Once the reference clock signal is lost, the CPU 14 enters into a free-run mode and the average control value of the VCO 17 is replaced with the control value measured at the normal mode.

But the prior art also requires the precision voltage controlled crystal oscillator, since the DP-PLL produces the system clock adjusted to be in synchronization with the single reference timing signal.

To solve the above-identified problem, apparatus for deriving a system clock signal using dual reference timing signals is disclosed in U.S. Pat. No. 5,136,617 issued Aug. 4, 1992 to Stenard.

The above apparatus proposes a synchronization system which is inexpensive and reliable by selecting one of a multiplicity of timing signals as the reference timing signal.

However, if the apparatus is applied to the network synchronization using DP-PLL, the phase-hit may be occurred according to switching of the reference timing signal at the time of transition of the operation mode.

SUMMARY OF THE INVENTION

It is an object of the present invention to provide a method and circuit for controlling a digital processing-phase locked loop for network synchronization that can prevent phase-hit generated at the time of switching of a reference timing signal and transition of the operation mode and abrupt phase instability or frequency fluctuation at the transferred mode.

The method for controlling the digital processing-phase locked loop for network synchronization comprises the steps of:

setting a value of 8000H corresponding to an initial center frequency at a voltage-controlled oscillator at the initial stage to a digital/analog converter(DAC) and bringing into a free-run mode;

transferring the free-run mode into a fast mode if at least one of two reference timing signals is determined to be in a normal state during the free-run mode;

setting a control value of the digital/analog converter to 8000H at the initial process of the fast mode storing phase deviation data for a predetermined period of time and computing its average value to set a quantized value of the average value as a reference phase deviation value of the fast mode;

storing the phase deviation deviation data for a predetermined period of time at the fast mode, computing and controlling a control value of the voltage controlled oscillator to converge the average value into the reference phase deviation value; and transferring the fast mode into a normal mode once the fast mode becomes stable, storing the phase deviation data for a predetermined period of time with maintaining final DAC control value in the fast mode at the initial process, measuring an average value to reset the quantized average value as a reference phase deviation value of the normal mode, and computing and controlling a control value of the voltage-controlled oscillator that is converged into the reference phase deviation value.

In the above four and five steps, if the abnormality is sensed in one reference timing signal which is being used as synchronization clock source and when another reference timing signal is determined as normal state, the synchronization clock source is changed from one reference timing signal to another reference timing signal.

At this time, the mode is transferred to the fast mode again, and there follows the step of computing and controlling a control value of the voltage controlled oscillator by setting as a reference phase deviation value a quantized value obtained by subtracting the average value of the present phase deviation data computed conversely from the final DAC control value in the previous mode, out of the average value of the phase deviation data for a predetermined period of time.

If both one and another reference timing signals are abnormal, the mode is transferred to a hold-over mode.

The hold-over mode is transferred to the fast mode, if any one of two reference timing signals is detected in a normal state.

Then, there follows the step of computing and controlling a control value of the voltage controlled oscillator by setting as a reference phase deviation value a quantized value obtained by subtracting the average value of the present phase deviation data computed conversely from the final DAC control value in the previous mode, out of the average value of the phase deviation data for a predetermined period of time.

After obtaining the average value as the reference phase deviation value, the present invention further comprises the steps of quantizing the average value and adding an offset value to the quantized average value.

As another aspect of the present invention, a circuit for controlling digital processing phase-locked loop for network synchronization comprises:

two E1 interfaces for receiving two reference timing signals from a digital clock supplying apparatus and deriving two a reference clock signals;

a reference clock selecting and dividing circuit for dividing two reference clock signals of the E1 interface and observing the loss of the selected reference clock signal;

a phase error detecting and storing means for counting a phase deviation data value between a comparison clock divided from a system clock and the clock selected in the reference clock selecting and dividing circuit by a system clock having the higher frequency among the system clocks to store it as phase deviation data;

control means for producing a control value(DACW) to synchronize the system clock with the selected synchronization clock by processing the phase deviation data read out in the phase deviation detecting and storing circuit according to the control algorithm; and a voltage conrolled oscillating circuit supplied with the DACW for converting it into analog signal, applying the analog signal to a voltage controlled oscilator and producing a synchronized system clock; and a divider for frequency dividing the system clock and producing a plurality of the divided system clocks, a frame pulse, and a multi-frame pulse.

BRIEF DESCRIPTION OF THE DRAWINGS

FIGS. 2A to 2C are timing diagrams of a phase detector of FIG. 1;

PREFERRED EMBODIMENT OF THE PRESENT INVENTION

Figure 1:
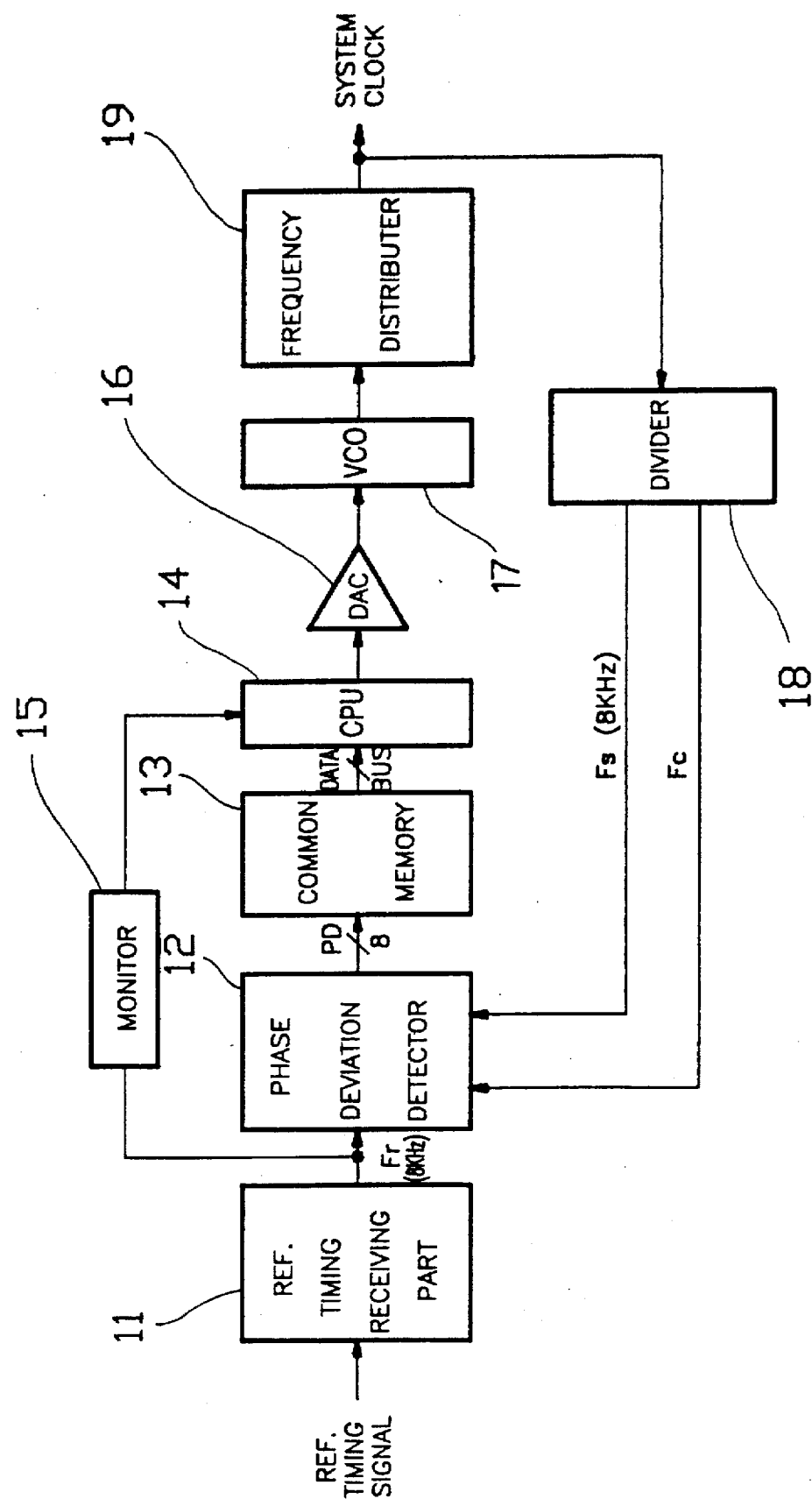
FIG. 1 is a block diagram of a conventional digital processing phase-locked loop for network synchronization.
Figure 3:
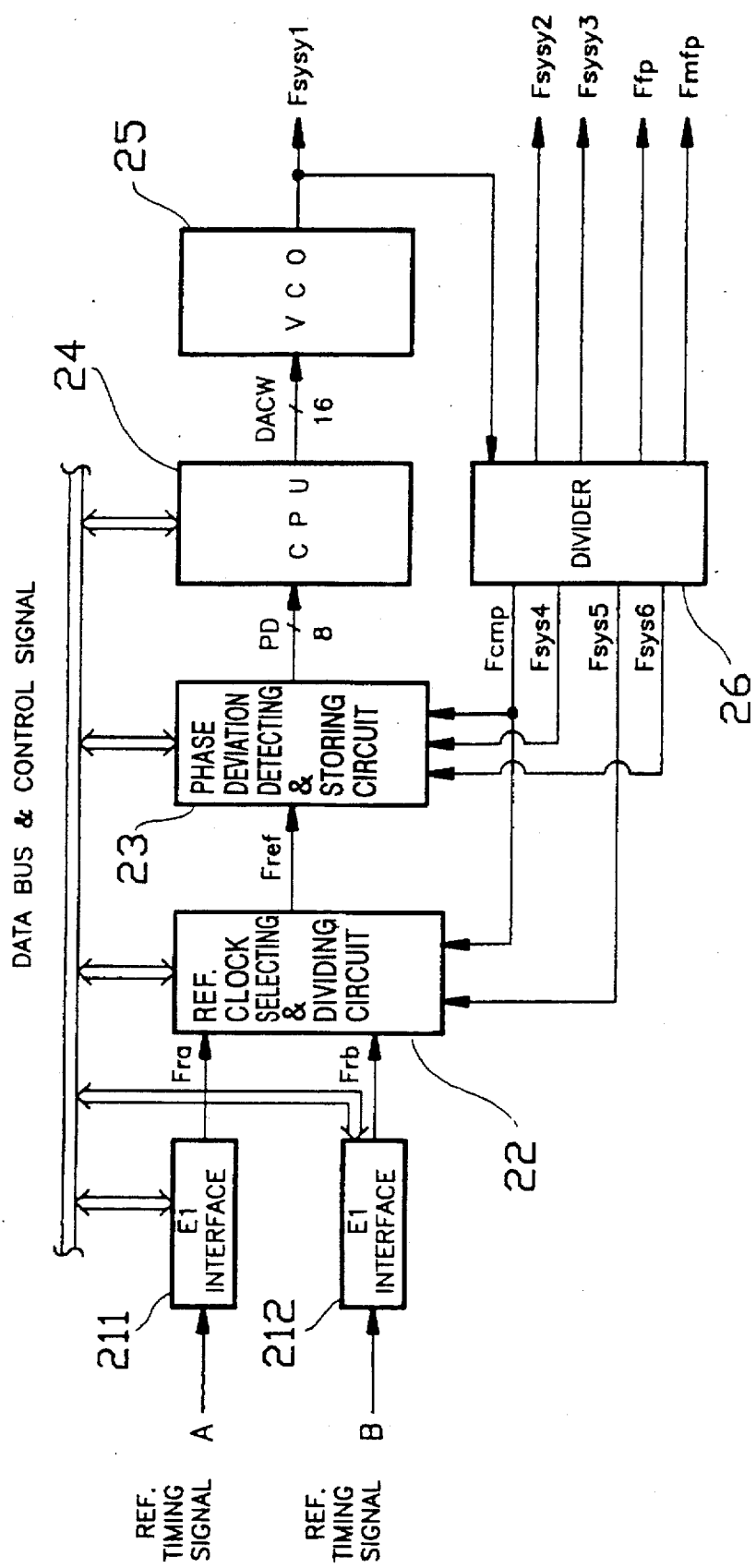
FIG. 3 is a block diagram of a digital processing-phase locked loop for network synchronization in accordance with the present invention.

FIG. 3 is a block diagram of a digital processing-phase locked loop for network synchronization.

The DP-PLL includes two E1 interfaces 211 and 212 that receive two reference timing signals A and B from outside to sample two reference clock signals Fra and Frb of 8 KHz, a reference clock selecting and dividing circuit 22 that divides each of two reference clock signals Fra and Frb of the E1 interfaces 211 and 212, selects one of divided reference clock signals Fra and Frb of 4 MHz based on a control signal as synchronized reference clock Fref, and observes a loss of the synchronized reference Fref using a comparison clock Fcmp of 8 KHz and a system clock Fsys5 of 3.24 MHz, a phase deviation detecting and storing part 23 that counts a phase deviation between the synchronized reference clock divided in the reference clock selecting and dividing circuit 22 and the divided system clock of 8 KHz, by a system clock Fsys4 of 6.48 MHz having the higher frequency among the system clocks and stores the quantized phase deviation data PD in dual port RAM at the period of 250 s; a central processing unit(CPU) 24 that processes the phase deviation data read in the phase deviation detecting and storing part 23 according to the control algorithm to produce a control value DACW to synchronize the system clock Fsys1 with the selected synchronized reference clock; a voltage-controlled oscillator 25 that synchronizes the phase of the system clock with the selected synchronized reference clock in response to the control value of 16 bits from the CPU 24 that is converted into an analog signal and produces the system clock Fsys1 of 51.84 MHz; a divider 26 that divides the system clock Fsys1 produced from the VCO 25 and produces a plurality of the clocks necessary for the reference clock selecting end dividing circuit 22 and phase deviation detecting and storing part 23.

The above E1 interfaces, each is comprised of a line interface which detects loss of signal (LOS) and a framer which detects out-of-frame(OOF), an alarm indication signal(AIS), a bit error rate(BER).

These informations are supplied with the CPU(24) and is used as switching of the synchronized clock source.

Figure 4:
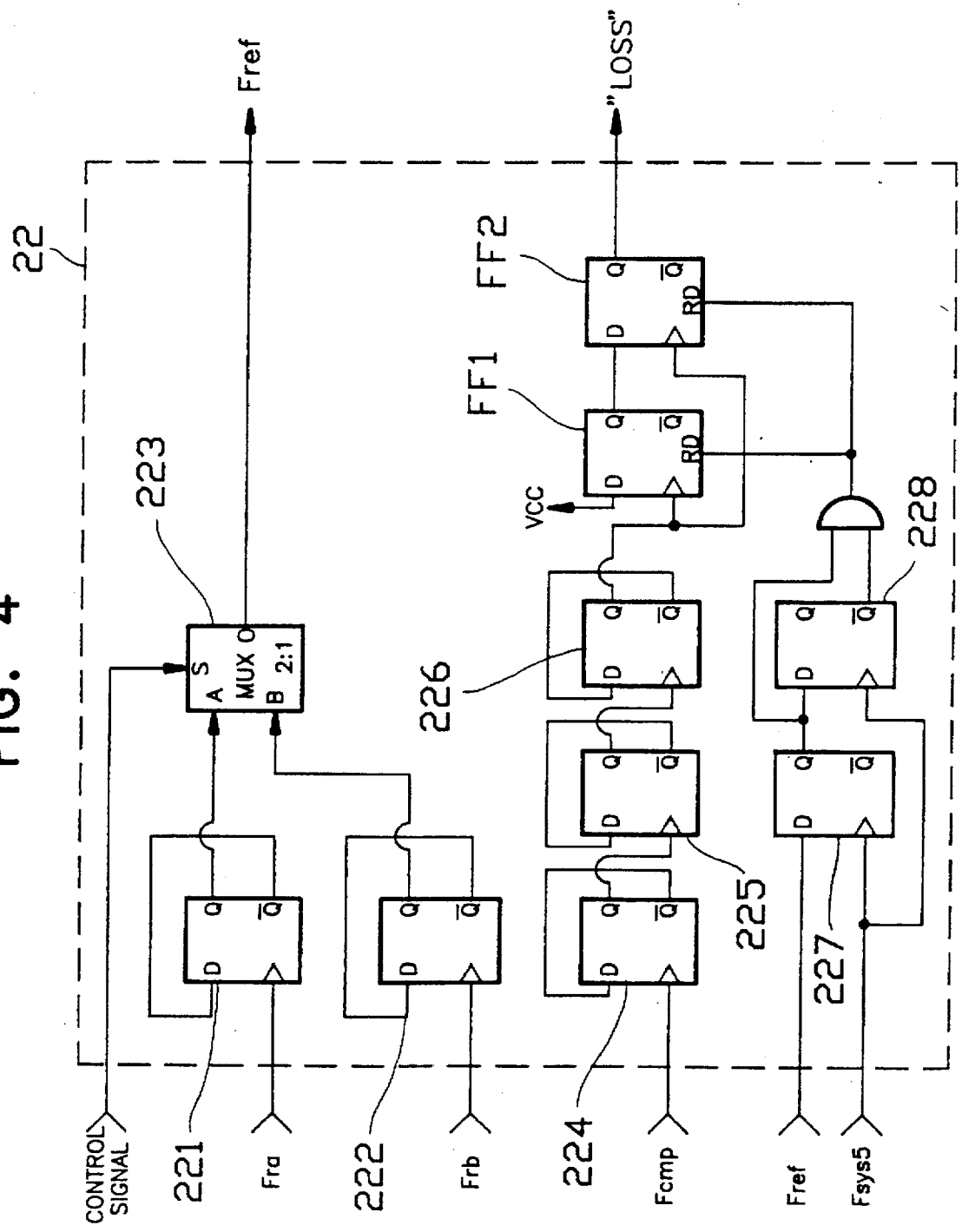
FIG. 4 is a detailed block diagram of a reference clock dividing and selecting circuit of FIG. 3.

As shown in FIG. 4, the reference clock selecting and dividing circuit 22 divides two reference clock signals Fra and Frb of 8 KHz by 2 to produce a clock of 4 KHz by two divide-by-2 circuit 221 and 222.

Then, one of two clocks of 4 KHz is selected as synchronized clock source Fref in accordance with the control signal from the CPU 24 in a multiplex (MUX) 223.

In addition, the comparison clock Fcmp of 8 KHz is divided by 8 using 3 dividers 224 to 226 to produce a clock of 1 KHz.

Also, from Fref of 4 KHz and a system clock Fsys5 of 3.24 MHz are obtained reset signal of the flip-flops FF1 and FF2.

Therefore, if Fref is not applied to the flip flop 227, Q of FF2 bcomes in the "H" level, thereby to detect loss of synchronized reference clock.

FIG. 4 shows a detailed block diagram of a phase deviation detecting and storing part. A counter enable signal generating circuit 230 produces an enable signal EN indicating a phase deviation between two clocks in response to the synchronized reference clock Fref, the comparison clock Fcmp and the system clock Fsys4 of 6.48 MHz.

A control signal generating circuit 231 outputs a clear signal LD clearing a counter of the phase deviation counter 232 using read signal RD output from the counter enable signal generating circuit 230 and the system clock Fsys6 of 128 KHz.

When EN signal is in the "H" level, the phase deviation counter 232 counts according to the system clock Fsys4 and clears according to the LD signal.

In this case, a maximum number capable of counting in the phase deviation counter 232 is ten bits by binary.

Figure 6:
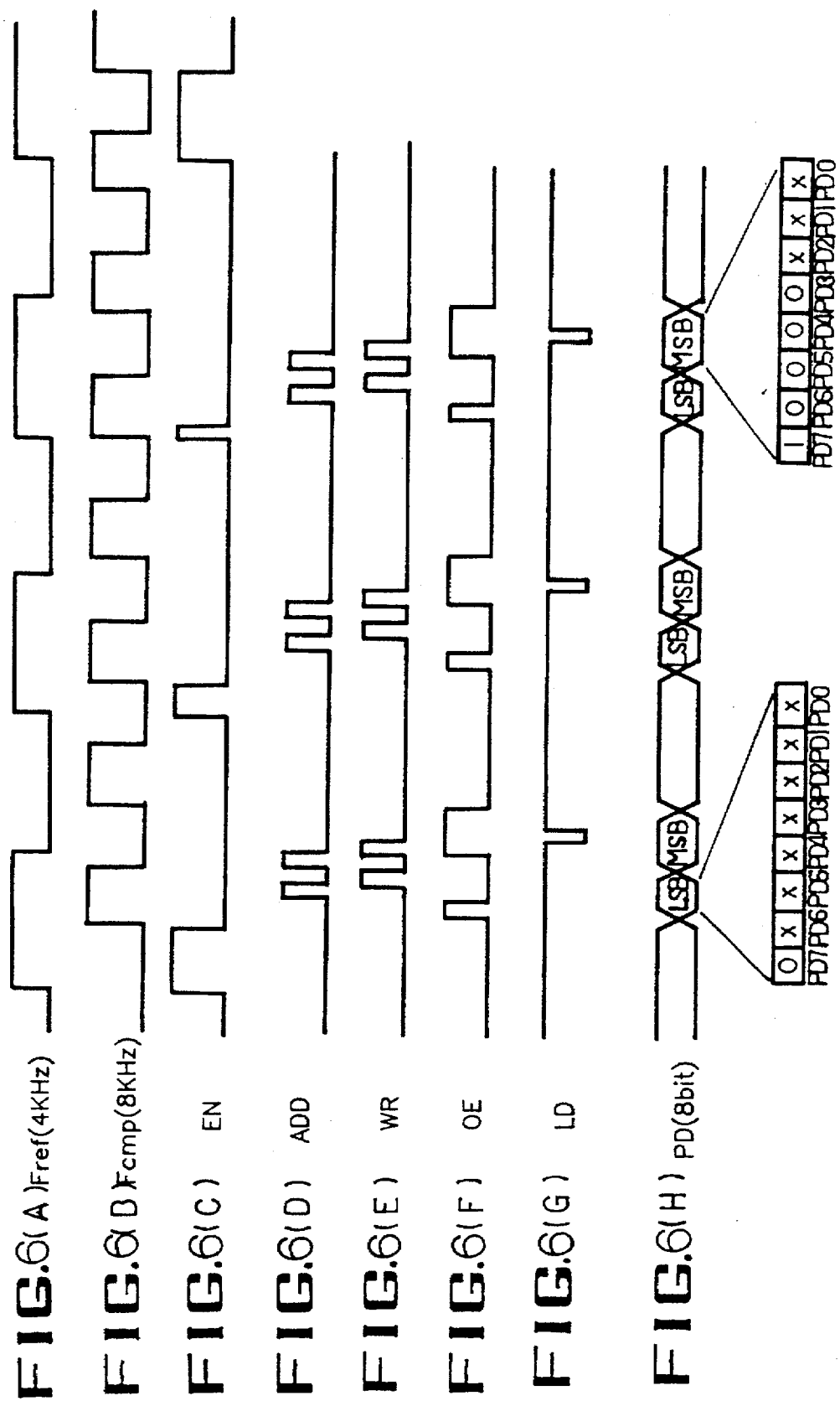
FIGS. 6A to 6H are timing diagrams of showing input/output of each part of FIG. 5.
Figure 7:
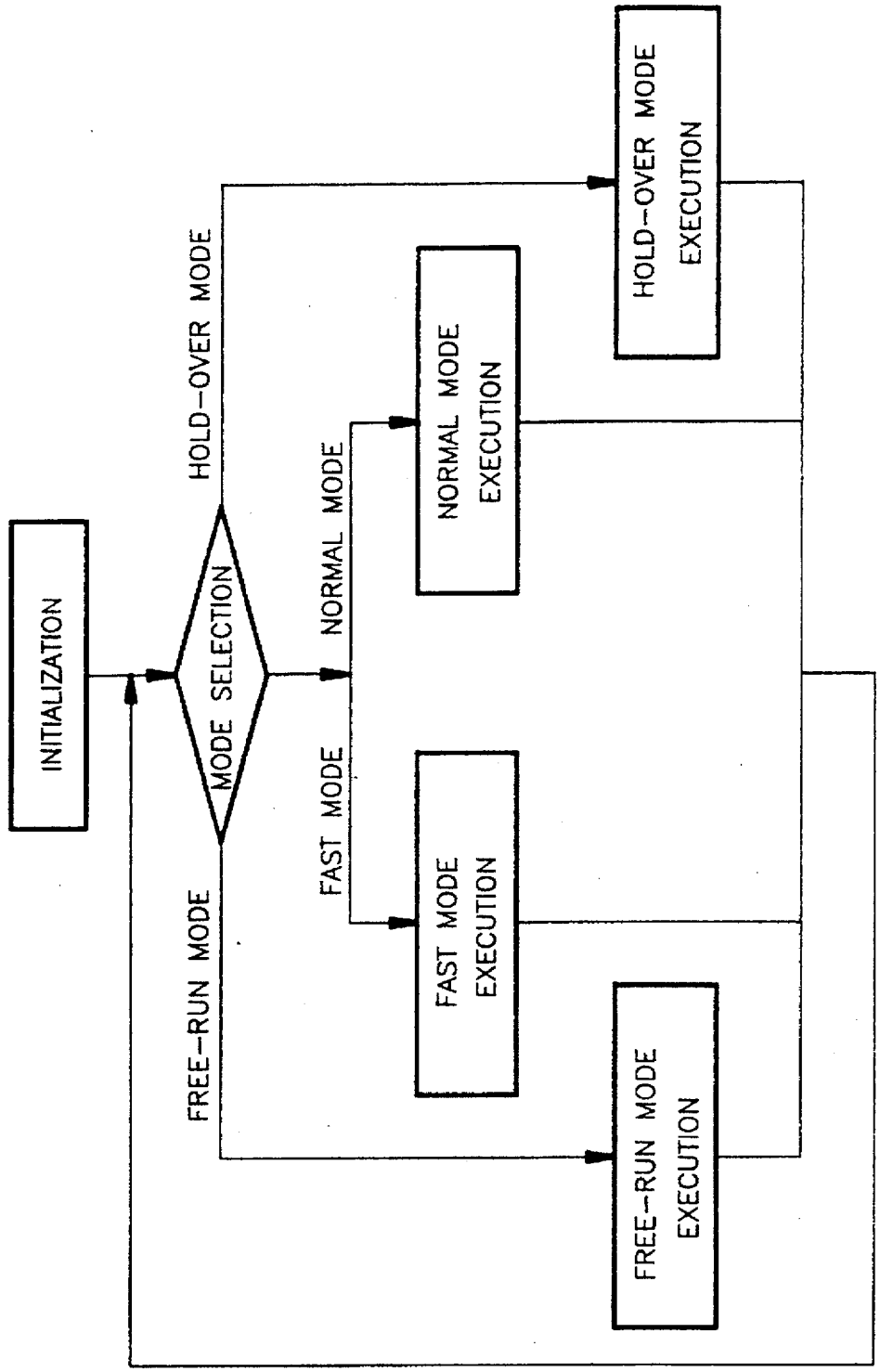
FIG. 7 is a flow chart of the mode selection of the digital processing phase-locked loop for network synchronization in accordance with the present invention.

To send ten bits of the phase deviation data to the CPU 24, the phase deviation data is divided by 3 bits of MSB and 7 bits of LSB and is sent to the CPU 24, in sequence as shown in FIG. 6(H).

To this case, in case PD7 is "O", the reminder PD6 to PD0 corresponds to lower 7 bits of the phase deviation data, in case PD7 is "1", PD2 to PD0 correspond to upper 3 bits. Therefore, the CPU 24 ascertains 7 bits of the PD 6 to PD0 and rearranges the phase deviation data.

Figure 5:
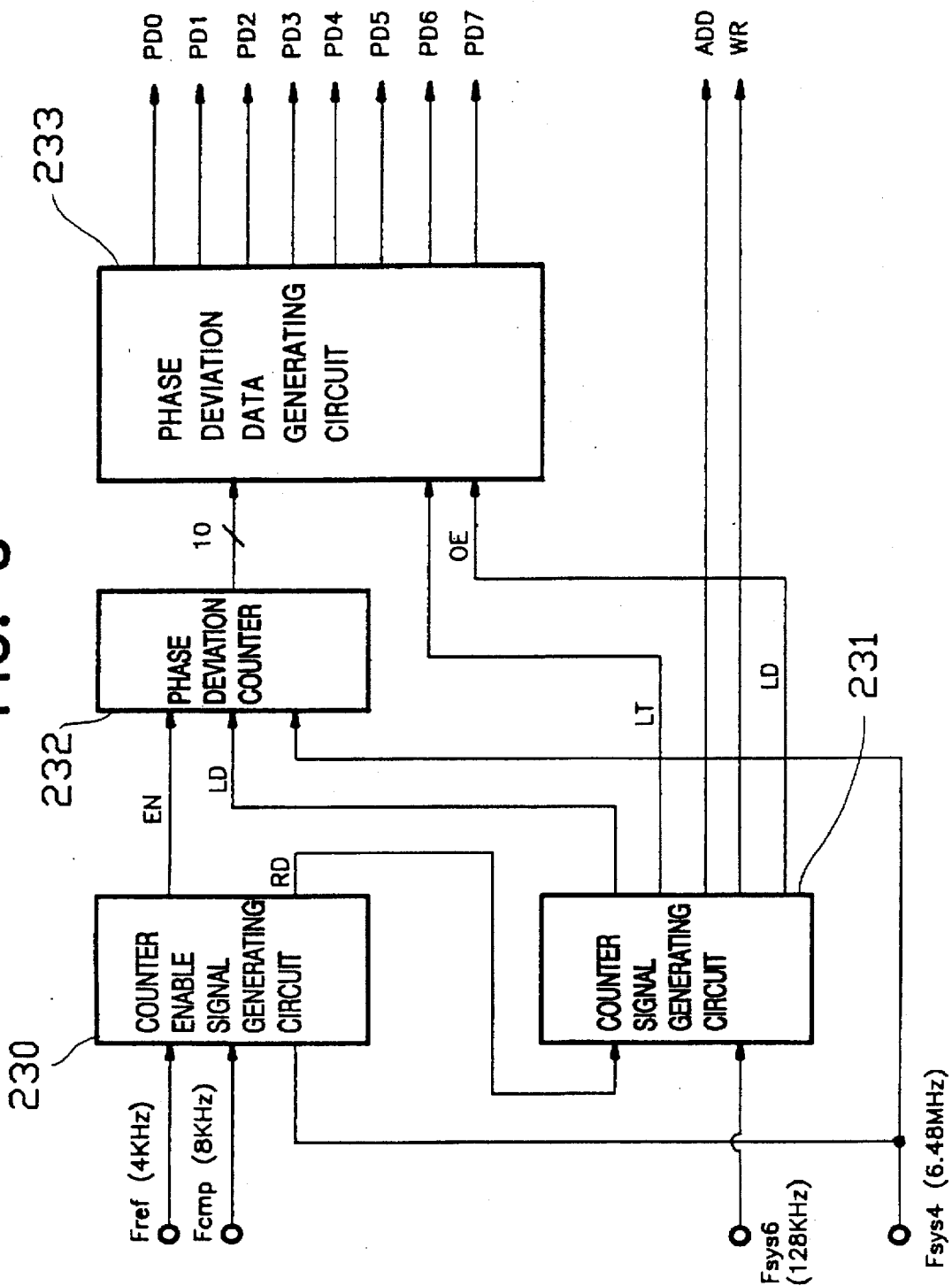
FIG. 5 is a detailed block diagram of a phase deviation detecting and storing part of FIG. 3.

In FIG. 5, LD designates a latch signal, ADD is an address increment counter pulse of the dual port RAM, and WR is a write pulse of the dual port RAM.

Referring now to FIGS. 3 to 6, the inventive digital processing-phase locked loop for network synchronization is described as follows.

For starters, if two reference timing signals are inputted from outside, the E1 interfaces 211,212 sample reference clock signals Fra and Frb and sends them to the reference clock selecting and dividing circuit 22. The reference clock selecting and dividing circuit 22 selects one of these reference clock signals enough to facilitate detection of the phase deviation, and monitors the loss of the reference clock signal.

In the phase deviation detecting and storing part 23, the finally selected reference clock signal Fref of 4 KHz is compared with the system clock signal of 8 KHz divided in the divider 26. The compared phase deviation is counted by a system clock Fsys4 of 6.48 HMz having the higher frequency among the system clocks, and is inputted to the CPU 24 as the phase deviation data PD.

Accordingly, the CPU 24 computes a control value DACW of 16 bits for controlling the VCO 25, using the phase deviation data PD inputted.

That is, at the initial stage, the CPU 24 sets values of 8000 H corresponding to the initial center frequency value at the VCO 25, and sets up the present mode as a free-run mode.

If LOS, AIS, BER and OOF of the reference clock signals A and B are not monitored during the execution of the free-run mode, the free-run mode is transferred to a fast mode or a normal mode. If any one of the LSO, ALS, BER and OOF are detected whenever the sampled phase deviation is read by 4 ms, the normal mode is transferred to a hold-over mode.

The description of each mode is as follows.

The CPU 24 enters into the free-run mode in the normal state, and then transferred to the fast mode. The CPU 24 stores the phase deviation data PD for a predetermined period of time Tsf at the initial stage of the fast mode, and computes an average value.

Then the average value is quantized, and the offset of 0.5000 is added to the quantized average value to set this value as a reference phase deviation value REF-PDW of the fast mode.

During the fast mode, the CPU 24 computes and controls a control value DACW of the VCO 25 to converge the above-mentioned phase deviation data PD into the reference phase deviation value REF-PDW, and once the fast mode becomes stable, the mode is transferred to a normal mode.

When it comes to entering into the normal mode, the CPU 24 stores the above phase deviation data PD for a predetermined period of time Tsn, and computes an average value. Then the average value is quantized, and the offset of 0.5000 is added to the quantized average value to set this value as a reference phase deviation value of the normal mode. The CPU 24 computes a control value value of the VCO 25 to converge the phase deviation data PD into the reference phase deviation value.

The above description is about the process of determining the reference phase deviation value of the normal operation, and the following one is about the process of determining the reference phase deviation value of the abnormal operation.

In the abnormal operation, if the fast mode or normal mode is transferred to a hold-over mode setting value of the reference phase deviation is not changed. The reference phase deviation value is reset, at the time of transferring from the normal mode to the fast mode when the clock source is changed because of the abnormality of one of the reference timing signals A and B which is selected as synchronized clock source.

Then, there follows the step of obtaining the average value of the phase deviation data stored for a predetermined period of time Tsf. The average value is quantized and to the quantized average value, the offset value of 0.5000 is added, the added result is set as reference phase deviation value.

If all the two reference timing signals is abnormal, the mode is transferred to the hold-ouer mode.

When any one of the reference timing signals is normally monitored at the hold-over mode, the mode is transferred to the fast mode. At this point, the reference phase deviation value is set as a quantized value obtained by subtracting the average value of the present phase deviation data that is computed conversely from the control value of the VCO 25 at the hold-over mode, out of the average value of the phase deviation data that is computed for a predetermined period of time. Further, to the quantized value, offset value of 0.5000 is added.

According to the present invention, since a control period in the fast mode and normal mode is variable, the time for entering into the pull-in range may be reduced. Besides, the phase discontinuity can be prevented by resetting the reference phase deviation data whenever the operation mode is transferred to another one. The present invention also provides advantages of preventing the abrupt phase or frequency instability that may occur at the time of transition of the mode and supplying stable system clock since the reference phase deviation can be exactly set even when the synchronization clock source is switched or is in an abnormal condition.

Moreover, when setting the reference phase deviation data, since to the quantized average value, the offset value of 0.5000 is added, the phase deviation data PD between the reference clock obtained in a locked-in state and the comparison clock is always including + − offset as to the reference phase deviation value, so that the DP-PLL operates to compensate the phase deviation.

Therefore, since the phase deviation due to quantized error occurred by the phase deviation detection is reduced, maximum time interval error may be reduced.

What is claimed is:

1. A method for controlling a digitally processing phase locked loop comprising the steps of:

setting a value corresponding to an initial center frequency of a voltage-controlled oscillator at an initial stage and bringing into a free-run mode;

determining the mode to be in a normal state unless an abnormality of a reference clock signal is not monitored in the free-run mode and transferring the free-run mode into a fast mode;

storing phase deviation data for a predetermined period of time as an initial process and computing an average value to set the average value as a reference phase deviation of the fast mode;

computing and controlling a control value of the voltage-controlled oscillator to converge the phase deviation data into the reference phase deviation;

transferring the fast mode into a normal mode once the fast mode becomes stable, storing the phase deviation data for a predetermined period of time as an initial process, measuring an average value to set the average value as a reference phase deviation of the normal mode, and computing and controlling a control value of the voltage-controlled oscillator that is converged into the reference phase deviation; and computing and controlling a control value of the voltage-controlled oscillator by setting as a reference phase deviation a value obtained by subtracting an average value of phase deviation data computed from the control value of the voltage-controlled oscillator in the normal mode, out of an average value of phase deviation data for a predetermined period of time after transferring from the normal mode to the fast mode, in case that the reference clock signal is in an abnormal condition.

2. A method for controlling a digitally processing phase locked loop comprising the steps of:

setting a value corresponding to an initial center frequency of a voltage-controlled oscillator at an initial stage and bringing into a free-run mode;

determining the mode to be in a normal state unless an abnormality of a reference clock signal is not monitored in the free-run mode and transferring the free-run mode into a fast mode;

storing phase deviation data for a predetermined period of time as an initial process and computing an average value to set the average value as a reference phase deviation of the fast mode;

computing and controlling a control value of the voltage-controlled oscillator to converge the phase deviation data into the reference phase deviation;

transferring the fast mode into a normal mode once the fast mode becomes stable, storing the phase deviation data for a predetermined period of time as an initial process, measuring an average value to set the average value as a reference phase deviation of the normal mode, and computing and controlling a control value of the voltage-controlled oscillator that is converged into the reference phase deviation;

transferring the fast mode or normal mode to a hold-over mode without changing a predetermined value of the reference phase deviation in case of an abnormal operation; and computing and controlling a control value of the voltage-controlled oscillator by setting as a reference phase deviation a value obtained by subtracting an average value of phase deviation data computed from the control value of the voltage-controlled oscillator in the hold-over mode, out of an average value of phase deviation data for a predetermined period of time after transferring from the hold-over mode to the fast mode, in case that the reference clock signal is normally monitored in the hold-over mode.

3. A method for controlling a digitally processing phase locked loop comprising the steps of:

setting a value corresponding to an initial center frequency of a voltage-controlled oscillator at an initial stage and bringing into a free-run mode;

determining the mode to be in a normal state unless an abnormality of a reference clock signal is not monitored in the free-run mode and transferring the free-run mode into a fast mode;

storing phase deviation data for a predetermined period of time as an initial process and computing an average value to set the average value as a reference phase deviation of the fast mode;

computing and controlling a control value of the voltage-controlled oscillator to converge the phase deviation data into the reference phase deviation;

transferring the fast mode into a normal mode once the fast mode becomes stable, storing phase deviation data for a predetermined period of time as an initial process, measuring an average value to set the average value as a reference phase deviation of the normal mode, and computing and controlling a control value of the voltage-controlled oscillator that is converged into the reference phase deviation;

quantizing each average value; and adding an offset value to each quantized average value.

4. A circuit for controlling digital processing phase-locked loop for network synchronization comprises:

two interfaces for receiving two reference timing signals from a digital clock supplying apparatus and deriving two reference clock signals;

a reference clock selecting and dividing circuit for dividing the two reference clock signals of the interfaces and observing a loss of a selected reference clock signal;

a phase deviation detecting and storing means for counting a phase deviation data value between a comparison clock divided from a system clock and a clock selected in the reference clock selecting and dividing circuit, by a system clock having the highest frequency among system clocks to store the value as phase deviation data;

control means for producing a control value to synchronize a system clock with the selected clock by processing the phase deviation data read out in the phase deviation detecting and storing circuit according to a control algorithm; and a voltage-controlled oscillating circuit supplied with the control value for converting the control value into an analog signal, applying the analog signal to a voltage-controlled oscillator and producing a synchronized system clock; and a divider for frequency dividing a system clock and producing a plurality of divided system clocks, a frame pulse, and a multi-frame pulse.

5. The circuit for network synchronization according to claim 4, wherein the phase deviation detecting and storing means computes the value obtained by counting intervals from a rising edge of a divided reference clock to a rising edge of a divided system clock.

6. The circuit for network synchronization according to claim 4, wherein the control means brings into a fast mode in case that a reference clock signal is normal at a free-run mode determined at an initial stage, stores phase deviation data for a predetermined period of time as an initial process, measures an average value of the phase deviation data, sets this average value as a reference phase deviation of the fast mode to compute a control value of the voltage-controlled oscillator, and stores detected phase deviation data for a predetermined period of time after the fast mode is transferred to a normal mode once the fast mode is stable, finds its average value, and then sets this average value as a reference phase deviation of the normal mode to compute a control value of the voltage-controlled oscillator.

7. The circuit for network synchronization according to claim 6, wherein the control means transfers the fast mode or normal mode to a hold-over mode without fluctuating the determined value of the reference phase deviation in case of an abnormal operation, transfers the hold-over mode to a fast mode if a reference clock is normally monitored in the hold-over mode, and computes a control value of the voltage-controlled oscillator by setting as a reference phase deviation a value obtained by subtracting an average value of phase deviation data computed from a control value of the voltage-controlled oscillator in the hold-over mode, out of an average value of phase deviation data for a predetermined period of time.

8. The circuit for network synchronization according to claim 6, wherein the control means computes a control value of the voltage-controlled oscillator by setting as a reference phase deviation a value obtained by subtracting an average value of phase deviation data computed from a control value of the voltage-controlled oscillator in the normal mode, out of an average value of phase deviation data for a predetermined period of time, after transferring from the normal mode to the fast mode, in case that the reference clock signal is in an abnormal condition.

* * * * *